United States Patent
Nakahara et al.

(10) Patent No.: US 9,263,852 B2
(45) Date of Patent: *Feb. 16, 2016

(54) SEMICONDUCTOR LASER AND OPTICAL SEMICONDUCTOR DEVICE

(71) Applicant: Oclaro Japan, Inc., Sagamihara, Kanagawa (JP)

(72) Inventors: Kouji Nakahara, Tokyo (JP); Yuki Wakayama, Tokyo (JP)

(73) Assignee: OCLARO JAPAN, INC., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/589,412

(22) Filed: Jan. 5, 2015

(65) Prior Publication Data

US 2015/0155687 A1 Jun. 4, 2015

Related U.S. Application Data

(63) Continuation of application No. 14/167,102, filed on Jan. 29, 2014, now Pat. No. 8,958,451.

(30) Foreign Application Priority Data

Jan. 31, 2013 (JP) ................................. 2013-017543

(51) Int. Cl.
*H01S 5/00* (2006.01)
*H01S 5/12* (2006.01)
(Continued)

(52) U.S. Cl.
CPC ............. *H01S 5/1215* (2013.01); *H01S 5/0287* (2013.01); *H01S 5/12* (2013.01);
(Continued)

(58) Field of Classification Search
CPC ..... H01S 5/1215; H01S 5/124; H01S 5/1246; H01S 5/12; H01S 5/0287
USPC ....................... 372/50.11, 50.1, 45.012, 45.01
See application file for complete search history.

(56) References Cited

U.S. PATENT DOCUMENTS 4,701,930 A * 10/1987 Akiba et al. .................... 372/96
4,796,273 A * 1/1989 Yamaguchi .................... 372/96
(Continued)

FOREIGN PATENT DOCUMENTS

JP 61-047685 A 3/1986
JP 61-216383 A 9/1986
(Continued)

OTHER PUBLICATIONS

Sakiano et al., "25.8Gbps Direct Modulation AlGaInAs DFB Lasers with Ru-doped InP Buried Heterostructure for 70° C. operation", OFC/NFOEC 2012 Technical Digest, OTh3F.3, 2012.
(Continued)

*Primary Examiner* — Kinam Park
(74) *Attorney, Agent, or Firm* — Mattingly & Malur, PC

(57) ABSTRACT

In the semiconductor laser including a diffraction grating in which a first diffraction grating region with a first pitch, a second diffraction grating region with a second pitch and a third diffraction grating region with the first pitch, an antireflection film coated on an end facet to the light-emitting side, and a reflection film coated on an opposite end facet, the first diffraction grating region is greater than the third diffraction grating region, and the second diffraction grating region is formed, in such a manner that phases of the first and third diffraction grating regions are shifted in a range of equal to or more than 0.6 π to equal to or less than 0.9 π, phases are successive on a boundary between the first and second diffraction grating regions and the phases are successive on a boundary between the second and third diffraction grating regions.

15 Claims, 10 Drawing Sheets

(51) Int. Cl.
*H01S 5/028* (2006.01)
*H01S 5/16* (2006.01)
*H01S 5/343* (2006.01)
*H01S 5/062* (2006.01)

(52) U.S. Cl.
CPC .............. *H01S 5/1246* (2013.01); *H01S 5/164* (2013.01); *H01S 5/34313* (2013.01); *H01S 5/0014* (2013.01); *H01S 5/06213* (2013.01); *H01S 5/124* (2013.01)

(56) References Cited

U.S. PATENT DOCUMENTS

| | | | | |
|---|---|---|---|---|
| 6,501,777 | B1* | 12/2002 | Sato | ............................. 372/50.11 |
| 8,958,451 | B2* | 2/2015 | Nakahara et al. | .......... 372/50.11 |
| 2006/0209911 | A1* | 9/2006 | Takabayashi | ................... 372/20 |

FOREIGN PATENT DOCUMENTS

| | | |
|---|---|---|
| JP | 62-095886 A | 5/1987 |
| JP | 2000-286502 A | 10/2000 |

OTHER PUBLICATIONS

Okai, "Spectral characteristics of distributed feedback semiconductor lasers and their improvements by corrugation-pitch-modulated structure", Journal of Applied Physics, 1994, vol. 75, No. 1, pp. 1-29.
Nakahara et al., "12.5-Gb/s Direct Modulation Up to 115° C. 1.3 μm InGaAlAs—MQW RWG DFB Lasers With Notch-Free Grating Structure", IEEE Journal of Lightwave Technology, 2004, vol. 22, No. 1, pp. 159-165.

* cited by examiner

SEMICONDUCTOR LASER AND OPTICAL SEMICONDUCTOR DEVICE

CROSS-REFERENCE TO RELATED APPLICATION

This application is a continuation of U.S. patent application Ser. No. 14/167,102, filed Jan. 29, 2014, which claims priority from Japanese application JP 2013-017543, filed Jan. 31, 2013, the content of which is hereby incorporated by reference into this application.

BACKGROUND OF THE INVENTION

1. Field of the Invention

The present invention relates to a semiconductor laser and an optical semiconductor device using the semiconductor laser and particularly to improvements in frequency characteristics and in fabrication yield of a semiconductor laser that has diffraction grating.

2. Description of the Related Art

At present, a higher transmission speed of an optical semiconductor device is desired. For example, a semiconductor laser for a wavelength-division multiplexing method is used in the optical semiconductor device using a communication light source for optical fiber communication to realize a transmission speed of 100 Gb/s that has become recently standardized. The optical semiconductor device includes a 4 channel semiconductor laser that is driven at the transmission speed of 25 Gb/s or 28 Gb/s per one channel, outputs light of different wavelengths, and realizes high capacity transmission. At present, an electroabsorption-modulated DFB-laser is used as the semiconductor laser that has the transmission speed of 25 to equal to or more than 28 Gb/s. For the optical semiconductor device, an optical transmitter and receiver using the laser element as a transmission light source has been in practical use. However, for the perspective of high-density integration into a high-speed router, there is a high demand for smaller size, lower power consumption, and lower cost in an optical communication transmitter and receiver with the speed of 100 Gb/s. Because a directly modulated laser element is simple in structure and thus is simple in implementation if high-speed operation of the directly modulated laser element can be realized, it is expected smaller size, lower power consumption, lower cost, and the like in the optical semiconductor device can be realized. In the transmission at the transmission speed of 10 Gb/s over a short distance of equal to or less than 10 km, the directly modulated laser element is already in practical use. The directly modulated laser element is a distributed feedback (hereinafter referred to as the DFB) laser element in which the structure of a cavity is DFB that oscillates with a single wavelength in a manner that makes the transmission over the distance of 10 km possible. For example, it is considered that the DFB laser element is also used in the directly modulated laser element with the high transmission speed of 25 to 28 Gb/s. Moreover, for example, a directly modulated semiconductor laser still on the drawing board, as the directly modulated laser element with the higher transmission speed, which is driven at the speed of 25 Gb/s or 28 Gb/s, is disclosed in "G. Sakiano, et al, '25.8 Gbps Direct Modulation AlGaInAs DFB Lasers with Ru-doped InP Buried Heterostructure for 70° C. operation,' OFC/NFOEC 2012 Technical Digest, OTh3F.3, 2012."

The DFB laser element has a structure in which diffraction grating is formed along an optical axis direction inside the element. Because oscillation occurs with two wavelengths in principle in the uniform diffraction grating structure, a contrivance is provided that oscillates in a single mode in a semiconductor laser with the diffraction grating. As one technology relating to the contrivance, there is a quarter-wave phase shifted ($\lambda/4$-shifted) diffraction grating structure. Furthermore, a dielectric film is coated on each of both facets of the semiconductor laser. The dielectric film in which light reflectivity on the end facet is low reflectivity is an anti-reflection film (a low reflection film) and the dielectric film in which the light reflectivity on the end facet is high reflectivity is a reflection film (a high reflection film). The semiconductor laser that has $\lambda/4$-shifteded diffraction grating structure is disclosed in JP 62-95886 A, JP 61-216383 A, JP 61-47685 A, and JP 2000-286502 A. In the semiconductor laser disclosed in the patent documents, an improvement in characteristics is made by combining an arrangement of a shift position of the $\lambda/4$-shift in the diffraction grating and a selection of dielectric films coated on the both facets of the semiconductor laser.

The semiconductor laser that has the $\lambda/4$-shifted diffraction grating structure has a problem in that the single mode cannot be maintained at the time of high optical output because optical intensity is localized in the shift position of the $\lambda/4$-shift. Therefore, the semiconductor laser that has a corrugation-pitch-modulated (CPM) diffraction grating structure as a structure for reducing the localization of the light intensity is disclosed in "Makoto Okai, 'Spectral characteristics of distributed feedback semiconductor lasers and their improvements by corrugation-pitch-modulated structure,' Journal of Applied Physics, Vol. 75, No. 1, pp. 1-29, 1994." In the semiconductor laser that has the CPM diffraction grating structure, the diffraction grating has a diffraction grating region for phase shift, and $\lambda/4$-shift is spatially made in the diffraction grating region in a gradual manner.

SUMMARY OF THE INVENTION

A technique of shortening a length L of a cavity in an active layer and a technique of raising an optical coupling coefficient κ of diffraction grating are considered as a technique of increasing a transmission speed of a semiconductor laser that has the diffraction grating. The former technique can reduce a volume of the active layer, and the latter technique can reduce a threshold gain of the element and can improve a differential gain. It is known that in the latter technique, particularly, the differential gain is improved by lowering the threshold gain in a laser with a strained quantum well. A relaxation oscillation frequency $f_r$ is increased by improving the differential gain. The relaxation oscillation frequency $f_r$ is expressed as a relationship between drive current $I_m$ (=current introduced into laser–threshold current) and a length L of the cavity in Formula 1 as follows.

$$f_r \propto \sqrt{\frac{I_m}{L}} \qquad \text{Formula 1}$$

An increase in the relaxation oscillation frequency $f_r$ realizes an increase in transmission speed and contributes to improvement in characteristics of a mask margin and the like. The inventors fabricated a DFB laser element (hereinafter referred to as a semiconductor laser according to a reference example) described below within the same wafer and researched the characteristics of the DFB laser element. Among the semiconductor lasers according to the reference example, the semiconductor laser according to a first reference example is the DFB laser element that has a $\lambda/4$-shifted diffraction grating structure, and the semiconductor laser according to a second reference example is the DFB laser element that has a CPM diffraction grating structure.

Although the semiconductor laser according to the first reference example has the same structure as the ridge-waveguide type DFB laser element in the related art that has a λ/4-shifted diffraction grating structure by which a transmission speed of 10 Gb/s is possible, the semiconductor laser is the DFB laser element that is greater in optical coupling coefficient κ of the diffraction grating than the DFB laser element in the related art. Among both facets of the corresponding DFB laser element, an anti-reflection film is coated on the front end facet from which to emit signal light, and a reflection film is coated on the rear end facet. Furthermore, the diffraction grating has an asymmetric structure in which a shift position of λ/4-shift is arranged close to the rear end facet. The semiconductor laser according to the first reference example has the same structure as the ridge-waveguide type DFB laser element that has a λ/4-shifted diffraction grating structure by which a speed of 10 Gb/s is possible, which is disclosed in "K. Nakahara, et al, '12.5-Gb/s Direct Modulation Up to 115° C. 1.3 μm InGaAlAs-MQW RWG DFB Lasers With Notch-Free Grating Structure,' IEEE Journal of Lightwave Technology, vol. 22, No. 1, pp. 159-165, 2004." In the DFB laser element disclosed in the patent document, κL is set to be approximately 1, the length L of the cavity is set to be 200 μm, and an optical coupling coefficient κ of the diffraction grating is approximately 50 cm$^{-1}$. In contrast, in the semiconductor laser according to the first reference example, the length L of the cavity is set to be 150 μm. Additionally, the optical coupling coefficient κ is set to be a great value of 120 cm$^{-1}$. Accordingly, it was verified that the relaxation oscillation frequency $f_r$ at the same drive current $I_m$ is increased.

However, the inventors found out that modulation characteristic deterioration in the low frequency range of the band was remarkable in terms of small-signal modulation characteristics of the semiconductor laser according to the first reference example. This is described below. FIG. 8 is a view illustrating small-signal modulation response characteristics of the semiconductor laser according to the reference example. In FIG. 8, the small-signal modulation response characteristics of the semiconductor laser according to the first reference example are indicated by a curved line 101 and the small-signal modulation response characteristics of the semiconductor laser according to the second reference example is indicated by a curved line 102. A vertical axis in FIG. 8 indicates optical response, and one graduation is 3 dB. A horizontal axis in FIG. 8 indicates a frequency f (GHz). Moreover, a dashed line in FIG. 8 indicates optical response of −3 dB. Furthermore, operating temperature of the semiconductor laser is set to be 55° C. and the operating current $I_m$ is set to be 50 mA.

As indicated by the curved line 101 in FIG. 8, in a low frequency region (0 to several GHz), small-signal modulation response of the semiconductor laser according to the first reference example is drastically decreased (roll-off of a band) and the response characteristics deteriorate. As a result, 3 dB bandwidth f3 dB indicating a frequency bandwidth is decreased to about 4 GHz. Generally, such characteristic deterioration in the low frequency range of the band is interpreted as being due to a parasitic circuit including a combination of a parasitic resistance and a parasitic capacitance inherent to the structure of the semiconductor laser. However, as a result of assiduously studying a cause of this, the inventors obtained a knowledge that the characteristic deterioration in the low frequency range of the band in terms of the frequency characteristics of the semiconductor laser according to the first reference example does not result from the parasitic circuit and results from a λ/4-shifted structure described below.

The semiconductor laser according to the second reference example has the optical coupling coefficient κ that is equal to that of the semiconductor laser according to the first reference example, and is the DFB laser element in which the λ/4-shift is set to be a CPM structure. The semiconductor laser according to the second reference example has the CPM diffraction grating structure, including a diffraction grating region where a pitch is modulated, in the center of the shift position of the λ/4-shift of the semiconductor laser according to the first reference example. That is, the semiconductor laser has an asymmetric structure in which the diffraction grating region is arranged close to the rear facet.

As indicated by the curved line 102 in FIG. 8, a small-signal modulation response of the semiconductor laser according to the second reference example is different from that according to the first reference example, the characteristic deterioration in the low frequency range of the band is suppressed, and 3 dB bandwidth f3 dB is remarkably increased to 20 GHz. Therefore, high frequency response characteristics can be exceedingly obtained compared to the semiconductor laser according to the first reference example.

Like a difference in frequency characteristics between the semiconductor lasers according to the first and second reference examples, a difference in frequency characteristics due to the diffraction grating structure was not public information. For the first time, the inventors have revealed the difference in frequency characteristics due to the diffraction grating structure. Furthermore, through the experiment, the inventors found out that the difference in frequency response characteristics in the low frequency range of the band due to the diffraction grating structure was small when the optical coupling coefficient κ was as small as 75 cm$^{-1}$ and the difference was more obvious when the optical coupling coefficient κ was as large as equal to or more than 120 cm$^{-1}$.

On the one hand, the inventors found out that the semiconductor laser according to the second reference example can result in the high frequency response characteristics compared to the semiconductor laser according to the first reference example, but there was a problem in that fabrication yield in a single mode was less. The element that oscillates with a single mode wavelength is included in the semiconductor laser according to the multiple second reference examples, fabricated by the inventors, but a two-mode oscillation element that oscillates with two wavelengths or an element that, when an amount of injection current is increased, changes from a single mode to a two-mode oscillation is included.

As described above, in the λ/4-shifted diffraction grating structure, when the optical coupling coefficient κ of the diffraction grating is raised, the characteristics in the low frequency range of the band in terms of the frequency characteristics deteriorate (the first reference example). On the other hand, as a result of adopting the CPM diffraction grating structure, the characteristics in the low frequency range of the band in terms of the frequency characteristics are improved, but the fabrication yield in the single mode is reduced (the second reference example). The present invention in view of these problems is made, and an object of the present invention is to provide a semiconductor laser and an optical semiconductor device that are capable of realizing an improvement in frequency characteristics as well as an improvement in fabrication yield.

Moreover, as a result of the assiduous study, the inventors found out that a difference in spatial hole burning between the λ/4-shifted diffraction grating structure and the CPM diffraction grating structure accounted for the difference in the frequency characteristics between the semiconductor lasers according to the first and second reference examples. This is described below.

FIG. 9A is a view illustrating distribution of carrier density and photon density in the semiconductor laser according to the first reference example. FIG. 9B is a view illustrating the distribution of the carrier density and the photon density in the semiconductor laser according to the second reference example. To make the description brief, the shift position of the λ/4-shift according to the first reference example is set to be the center of both facets of the element, thereby resulting in a symmetrical structure. In the same manner, the center of a diffraction grating region (a pitch modulation region CPM) for phase shift according to the second reference example is set to be the center of the both facets of the element. In each of FIGS. 9A and 9B, the photon density is indicated by a curved line LD1 in a case where optical output is great, and the photon density is indicated by a curved line LD2 in a case where the optical output is small. Moreover, the carrier density is indicated by a curved line CD1 in the case where the optical output is great, and the carrier density is indicated by a curved line CD2 in the case where the optical output is small.

Because light concentrates on the shift position of the λ/4-shift in the λ/4-shifted diffraction grating structure illustrated in FIG. 9A, carrier density is locally decreased mainly in the shift position due to the stimulated emission. A case is described where, of current injected into the semiconductor laser, mainly bias current is modulated as is done when the small-signal modulation characteristics are measured. When the current is injected in large amounts and the optical output is increased, because the photon density in the vicinity of the shift position becomes locally high, the carrier density is increasingly locally reduced. When the carrier density is locally reduced, because a spatial density gradient (a concentration gradient) of the carriers occurs, the carriers move within the active layer of the semiconductor laser from all lateral direction, mainly axial direction which is along the optical axis, in such a manner as to reduce the density gradient. When photon density in the shift position is relatively reduced corresponding to the decrease of the current being injected, then the carriers move within the active layer in the direction opposite to the corresponding axial direction, because the density gradient becomes more gradual than when the optical output is strong. Among free electrons and holes that are the carriers, because mobility of the holes is low, a response speed of a carrier movement in the axial direction within the active layer described above is determined by mobility of the holes and then the response speed is delayed. It is considered that the characteristic deterioration in the low frequency range of the band due to the movement of the carriers in the axial direction occurs.

In contrast, because the phase shift occurs gradually and spatially in the CPM diffraction grating structure as illustrated in FIG. 9B, increases in the photon density in the shift position and in the vicinity of the shift position are distributed more gradually than in the λ/4-shifted diffraction grating structure illustrated in FIG. 9A. Therefore, because the reduction in the number of carriers due to the stimulated emission is gradual, the reduction in carrier density corresponding to the increase in photon density due to the modulation also becomes spatially gradual. As a result, the density gradient of the carriers is reduced, and the movement of the carriers in the axial direction also is decreased. Therefore, it is considered that in the CPM diffraction grating structure, the deterioration in the low frequency range of the band in terms of the frequency characteristics is suppressed and widening of the band width for characteristics can be realized.

(1) In order to solve the problems described above, according to an aspect of the present invention, there is provided a semiconductor laser including a diffraction grating in which a first diffraction grating region that has a periodic structure with a first pitch, a second diffraction grating region that has a periodic structure with a second pitch different from the first pitch, and a third diffraction grating region that has the periodic structure with the first pitch are arranged sequentially and contiguously side by side along a direction of light propagation beginning from a light-emitting side, an anti-reflection film that is coated on one facet to the light-emitting side, and a reflection film that is coated on the other facet that is opposite the facet to the light-emitting side, in which the first diffraction grating region is greater, in a length along the direction of light propagation, than the third diffraction grating region, and in which the second diffraction grating region has the second pitch and the length, which runs along the direction of light propagation, of the second diffraction grating region, in such a manner that a phase of the first diffraction grating region and a phase of the third diffraction grating region are shifted in a range of equal to or more than $0.6\pi$ to equal to or less than $0.9\pi$, the phase of the first diffraction grating region and a phase of the second diffraction grating region are successive on a boundary between the first and second diffraction grating regions and the phase of the second diffraction grating region and the phase of the third diffraction grating region are successive on a boundary between the second and third diffraction grating regions.

(2) In the semiconductor laser described in (1), a structure of a cavity may be a distributed feedback type.

(3) In the semiconductor laser described in (1) or (2), the semiconductor laser may have either a ridge-waveguide type structure or a buried type structure.

(4) The semiconductor laser described in any one of (1) to (3) may further include an active layer that includes an InGaAlAs multi-quantum well layer.

(5) In the semiconductor laser described in any one of (1) to (4), optical coupling coefficient of the diffraction grating may be equal to or more than $120$ $cm^{-1}$.

(6) In the semiconductor laser described in any one of (1) to (5), the length that runs along the direction of light propagation of the diffraction grating may be equal to or less than 150 μm.

(7) According to another aspect of the present invention, there is provided an optical semiconductor device including the semiconductor laser described in any one of (1) to (6).

According to the present invention, there is provided a semiconductor laser and an optical semiconductor device that are capable of realizing an improvement in frequency characteristics as well as an improvement in fabrication yield.

DETAILED DESCRIPTION OF THE INVENTION

Figure 1:
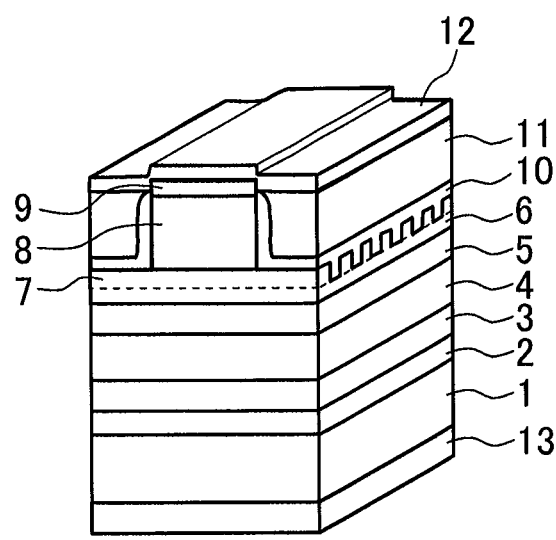
FIG. 1 is a perspective view of an entire main portion of a semiconductor laser according to a first embodiment of the present invention.

Embodiments of the present invention are described below specifically and in detail referring to the drawings. Moreover, in figures for describing the embodiments, members that have the same function are given the same reference numeral and the redundant descriptions thereof are omitted. Furthermore, the figures below referred to are only for describing the embodiments, and a size of each figure and an illustration scale of the embodiment are not necessarily consistent with each other.

First Embodiment

Figure 2:
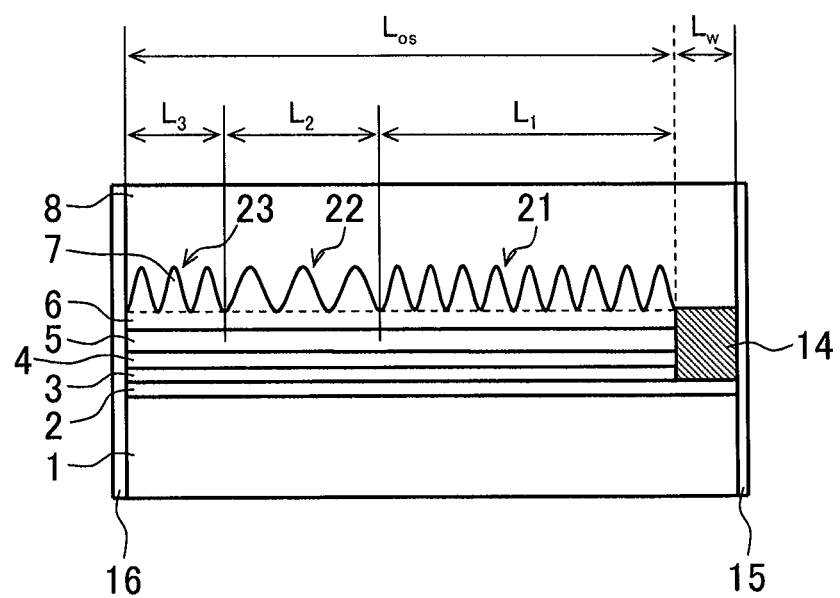
FIG. 2 is a cross-sectional view of the semiconductor laser according to the first embodiment of the present invention.

A semiconductor laser (semiconductor laser element) according to a first embodiment of the present invention is a DFB laser element that has a CPM diffraction grating structure and is a ridge-waveguide type laser element that oscillates in a 1.3 μm band. That is, a cavity structure of a laser element is a DFB type (distributed feedback type), and an optical confinement structure and a current constriction structure of the laser element are a ridge-waveguide type structure. The semiconductor laser according to the corresponding embodiment can be used as a transmission light source for optical fiber communication. FIG. 1 is a perspective view of an entire main portion of the semiconductor laser according to the corresponding embodiment. FIG. 2 is a cross-sectional view of the semiconductor laser according to the corresponding embodiment. FIG. 2 illustrates a cross-section of the inside the laser element, which includes an optical axis of light and extends in a deposition direction.

The semiconductor laser according to the corresponding embodiment is an element having an n-type InP substrate 1 on which semiconductor multilayer is deposited. Moreover, an n-type InP buffer layer is formed on an upper surface of the n-type InP substrate 1, but is not illustrated in FIGS. 1 and 2. As illustrated in FIGS. 1 and 2, an n-type InGaAlAs-SCH layer 2, an InGaAlAs-MQW layer 3, a p-type InGaAlAs-SCH layer 4, a p-type InAlAs electron stop layer 5, an InGaAsP etching stop layer 6, and an InGaAsP diffraction grating layer 7 are deposited on the n-type InP substrate 1 in this sequence to form semiconductor multilayer. Here, the InGaAlAs-MQW layer 3 is a multi-quantum well layer that has five well layers. Furthermore, the InGaAsP etching stop layer 6 and the InGaAsP diffraction grating layer 7 may be the same in composition, and may be mixed crystals that differ in composition.

A p-type InP clad layer 8 and a p-type InGaAs contact layer 9 that have a low mesa structure are formed, in this sequence, on a region, which is over an optical waveguide, of an upper surface of the InGaAsP diffraction grating layer 7. That is, the corresponding semiconductor laser has a ridge-waveguide structure. A $SiO_2$ protective film 10 is coated in such a manner as to cover a region, in which the low mesa structure is not formed, and lateral surfaces of the low mesa structure, out of the upper surface of the InGaAsP diffraction grating layer 7. Additionally, a polyimide layer 11 is formed in such a manner as to cover the $SiO_2$ protective film 10. Additionally, a p-type electrode 12 made from Ti/Pt/Au is formed to come into contact with a p-type InGaAs contact layer 9, and an n-type electrode 13 made from AuGe/Ni/Ti/Pt/Au is formed on a lower surface (a rear surface) of the n-type InP substrate 1. At this point, "/" means that materials are deposited beginning with the leftmost material and ending with the rightmost material. Furthermore, the polyimide layer 11 is formed to reduce parasitic capacitance due to a pad portion of the p-type electrode 12. Moreover, to make the description brief, the main portions of the semiconductor laser according to the corresponding embodiment are illustrated in FIG. 1, but, in fact, the semiconductor multilayer is formed to such an extent that it spreads from both lateral sides of the figure. Furthermore, a part on which a below-described InGaAsP waveguide layer 14 is formed is not illustrated. To make the description brief, the p-type InGaAs contact layer 9, the p-type electrode 12, and the n-type electrode 13 are omitted in FIG. 2. The right side facet of the semiconductor laser illustrated in FIG. 2 is an facet (the front facet) from which to emit signal light. On the InGaAsP diffraction grating layer 7, a first diffraction grating region 21 (a length $L_1$), a second diffraction grating region 22 (a length $L_2$), and a third diffraction grating region 23 (a length $L_3$) are arranged sequentially and contiguously side by side along a direction of light propagation (an extending direction of the optical waveguide) beginning from a light-emitting side. Moreover, the InGaAsP diffraction grating layer 7 illustrated in FIG. 2 is indicated using a sine function in such a manner that a change in phase is understood along the direction of light propagation, but, in fact, in each diffraction grating region, the InGaAsP diffraction grating layer 7 takes a periodic concave-convex shape with a predetermined pitch. The InGaAsP waveguide layer 14 is formed between the right side facet of the semiconductor laser and the right side facet of the semiconductor multilayer including the InGaAlAs-MQW layer 3 and the InGaAsP diffraction grating layer 7.

Among both facets, which are coated along the direction of light propagation, of the semiconductor laser according to the corresponding embodiment, the facet (the front facet) from which to emit the signal light is a facet to the side of the first diffraction grating region 21, and an anti-reflection film 15 is coated on the corresponding facet. At this point, it is preferable that on the facet, the anti-reflection film 15 be a low reflection film (a low reflection coating layer) that is equal to or less than 0.1% in effective reflectivity, and here, the low reflection film that is equal to or less than 0.1% in effective reflectivity is used. However, the low reflection film is not limited to this value and the low reflective film that is equal to or less than 1% in effective reflectivity can be used. Furthermore, the facet (the rear facet) that is opposite to the front facet is a facet to the side of the third diffraction grating region 23, and a reflection film 16 is coated on the corresponding facet. At this point, it is preferable that on the facet, the reflection film 16 be a high reflection film (a high reflection coating layer) that is equal to or more than 90% in reflectivity, and here, the high reflection film that is 95% in reflectivity is used. However, the high reflection film is not limited to this value and the high reflective film that is equal to or more than 70% in reflectivity can be used. A coating of the low reflection film forms an anti-reflection film (the low reflection film) on the facet, and the formation of a reflection film (the high reflection film) on the facet is by the high reflection coating.

An active layer at which light occurs includes the InGaAlAs-MQW layer 3, and the InGaAsP diffraction grating layer 7 is arranged in the vicinity of the InGaAlAs-MQW layer 3 along the direction of light propagation. Moreover, the diffraction grating may be provided on the active layer or on a layer in the vicinity of the active layer. A length, which runs along the direction of light propagation, of the semiconductor multilayer including the InGaAlAs-MQW layer 3 and the InGaAsP diffraction grating layer 7 is a length $L_{OS}$ of a cavity, and here is 150 μm. A length, which runs along the direction of light propagation, of the InGaAsP waveguide layer 14, is a waveguide layer length $L_W$, and here is 50 μm. Therefore, a laser element length that is a distance between both facets of the semiconductor laser is 200 μm. Although the length $L_{OS}$ of the cavity is shortened to 150 μm, cleaving can be easily performed in a mass production process.

A height of a convex portion of the InGaAsP diffraction grating layer 7 is 53 nm and an optical coupling coefficient κ of the diffraction grating is 150 cm$^{-1}$ in either of the first diffraction grating region 21, the second diffraction grating region 22, and the third diffraction grating region 23. The first diffraction grating region 21 and the third diffraction grating region 23 have a periodic structure with a pitch of 200 nm (a first pitch: $\Lambda_{STD}$). In contrast, the second diffraction grating region 22 (a CPM diffraction grating region) has the periodic structure with a pitch of 200.2996 nm (a second pitch: $\Lambda_{CPM}$). The first pitch and the second pitch are different from each other. When a length $L_2$, which runs along the direction of light propagation, of the second diffraction grating region 22 is set to be a length $L_{CPM}$ of the CPM diffraction grating, the length $L_{CPM}$ of the CPM diffraction grating is set to be 50.075 μm in the semiconductor laser according to the corresponding embodiment. The second pitch $\Lambda_{CPM}$ and the length $L_{CPM}$ of the CPM diffraction grating are determined in such a manner that the equivalent phase shift in the second diffraction grating region 22 is in the same amount as a phase shift between the first diffraction grating region 21 and the third diffraction grating region 23. The proper selection of the second pitch and the length of the CPM diffraction grating can successively change the phase of the diffraction grating in the InGaAsP diffraction grating layer 7 over the first to third diffraction grating regions. That is, on the boundary between the first diffraction grating region 21 and the second diffraction grating region 22, a phase of the first diffraction grating region 21 and a phase of the second diffraction grating region 22 are successively connected to each other, and on the boundary between the second diffraction grating region 22 and the third diffraction grating region 23, the phase of the second diffraction grating region 22 and a phase of the third diffraction grating region 23 are successively connected to each other. Moreover, the center of the second diffraction grating region 22 is arranged at a position that is 70% of the length $L_{OS}$ of the cavity, 105 μm, away from the right side end (the front end) of a portion (a cavity portion) that is indicated as the length $L_{OS}$ of the cavity. That is, the center of the second diffraction grating region 22 is arranged at such a position that a ratio of the front to the rear of the length $L_{OS}$ of the cavity is 7:3. According to the corresponding embodiment, the center of the second diffraction grating region 22 is arranged at the position that is 70% of the cavity portion away from the front end of the cavity portion, but is not limited to 70% of the cavity portion. When the center of the second diffraction grating region 22 is arranged closer to the front end than the rear end of the cavity portion (is arranged at the position that is less than 50% of the length of the cavity away from the front end), a yield of a single mode wavelength is remarkably reduced. For the perspective of the yield of the single mode wavelength, it is preferable that the center of the second diffraction grating region 22 be arranged closer to the rear end than the front end of the cavity portion, in which case a length $L_1$ of the first diffraction grating region is greater than a length $L_3$ of the third diffraction grating region. Additionally, it is preferable that a distance from the front end of the cavity portion to the center of the second diffraction grating region 22 should range from equal to or more than 55% to equal to or less than 80%. However, the distance is set to be in a range where a length $L_3$ of the third diffraction grating region 23 is present.

Figure 8:
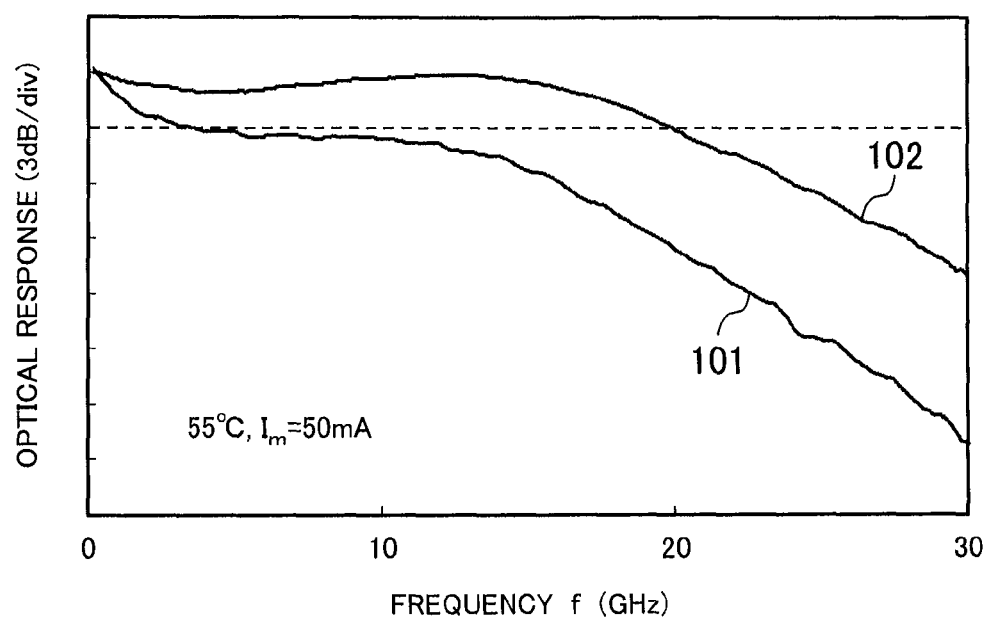
FIG. 8 is a view illustrating small-signal modulation response characteristics of a semiconductor laser according to a reference example.
Figure 9A:
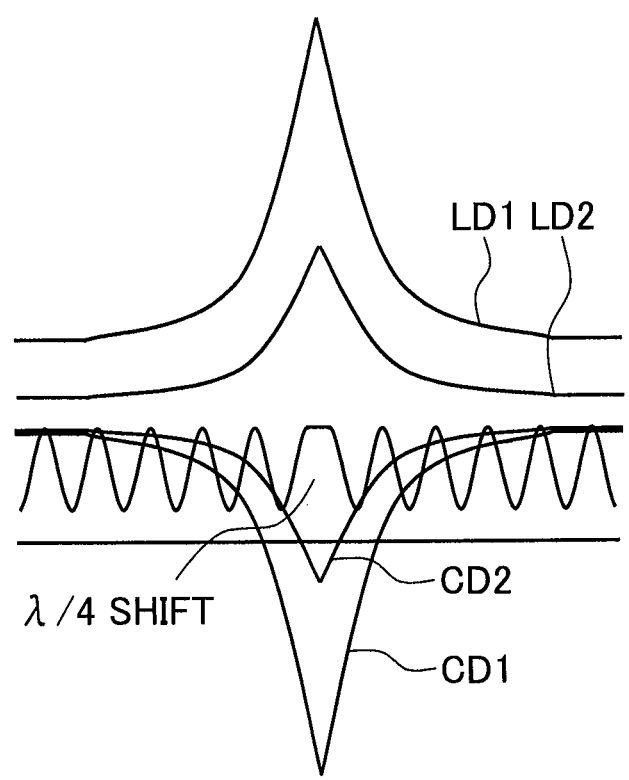
FIG. 9A is a view illustrating distribution of carrier density and photon density in a semiconductor laser according to a first reference example.
Figure 9B:
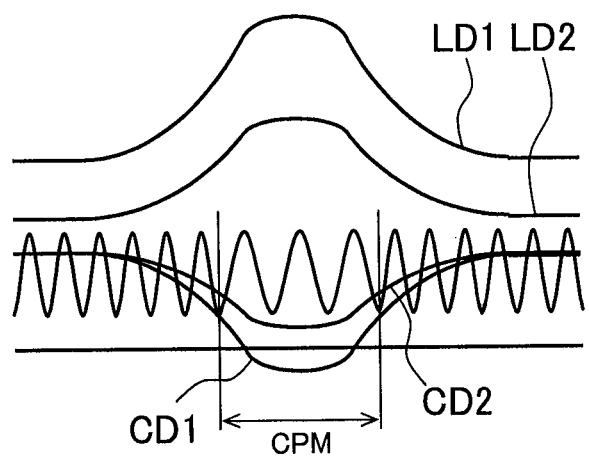
FIG. 9B is a view illustrating the distribution of the carrier density and the photon density in a semiconductor laser according to a second reference example.

The semiconductor laser according to the corresponding embodiment has the optical coupling coefficient κ of the diffraction grating with a value as high as 150 cm$^{-1}$, and has the length $L_{OS}$ of the cavity with a value as low as 150 μm. Although the semiconductor laser is a ridge-waveguide type DFB laser element, a threshold current is 4.0 mA at a temperature of 25° C. and is 5.8 mA at a temperature of 55° C. and thus securing of a low threshold current can be realized. Additionally, the single mode yield in terms of pulse measurement is equal to or more than 90%, and an improvement in yield is realized. Excellent characteristics are realized to such an extent that inclinations of a relaxation oscillation frequency $f_r$ with respect to the square root of a drive current are 3.4 GHz/mA$^{1/2}$ and 3.1 GHz/mA$^{1/2}$ at temperatures of 25° C. and 55° C., respectively. Additionally, although the optical coupling coefficient κ is great, as indicated by the curved line 102 in FIG. 8, characteristic deterioration (roll-off of a band) in the low frequency range of the band in terms of small-signal modulation characteristics is suppressed and high frequency characteristics can be obtained to such an extent that 3 dB bandwidth f3 dB is approximately 20 GHz.

Figure 3:
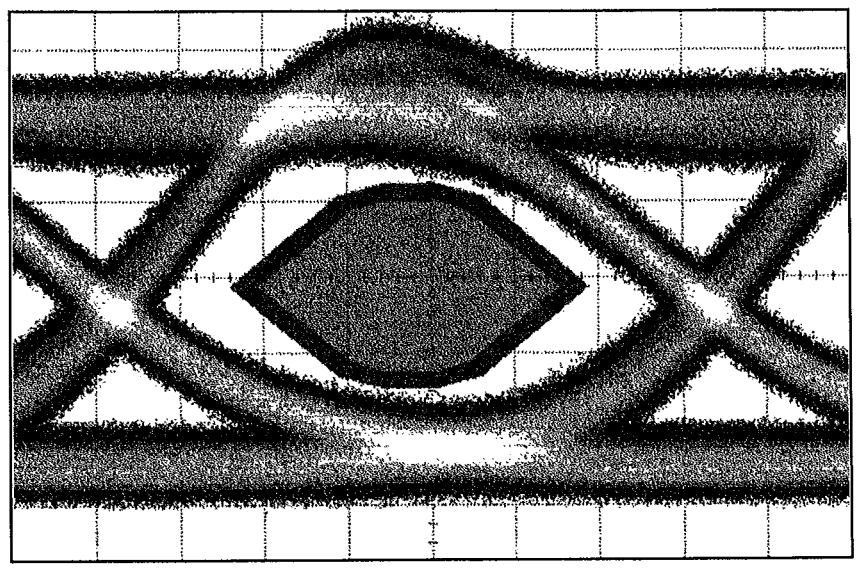
FIG. 3 is a view illustrating an eye pattern of the semiconductor laser according to the first embodiment of the present invention.

FIG. 3 is a view illustrating an eye pattern of the semiconductor laser according to the corresponding embodiment. One graduation along a horizontal axis is 5 ps/div in FIG. 3. The semiconductor laser according to the corresponding embodiment has a low threshold current and high frequency characteristics. Thus, under the conditions that a transmission speed is 27.952 Gb/s that is an OTU4 specification, a bias current is 58 mA, and a drive temperature is 55° C., high characteristic can be realized to such an extent that an obtained extinction ratio is 5.64 dB and a mask margin of IEEE mask is 21%. Moreover, an evaluation is also performed on the semiconductor laser according to a first reference example described above, but the inclination of the relaxation oscillation frequency $f_r$ with respect to the square root of the drive current is almost no different from that according to the corresponding embodiment. Nonetheless, the mask margin of 3% under the same conditions as in the corresponding embodiment is exceedingly small, compared to the corresponding embodiment. Therefore, in the semiconductor laser according to the first reference example, this results from the characteristic deterioration (roll-off of the band) in the low frequency range of the band. It is considered that because at an eye opening, the mask margin does not drop to a 0 level, the mask margin is reduced. Moreover, the semiconductor laser according to the corresponding embodiment can obtain such high reliability that an estimated life time is 3.2×10$^5$ hours at a drive temperature of 55° C.

The semiconductor laser according to the corresponding embodiment is described above. In the semiconductor laser according to a second reference example described above, a cause of reduction in the yield of the single mode is studied with assiduity. As a result, the inventors have made it apparent that an amount of phase shift of the CPM diffraction grating region (the second diffraction grating region 22), which becomes optimized for the perspective of the yield of the single mode, differs by selection of a dielectric film coated on both facets of the element. This leads to the present invention. If the anti-reflection film is coated on both facets of the semiconductor laser, the amount of phase shift of the CPM diffraction grating region is optimized as π. In contrast, in the semiconductor laser according to the corresponding embodiment, the reflection suppression film is coated on the facet (the front facet) to the light-emitting side, and the reflection film is coated on the facet (the rear facet) opposite to the facet to the light-emitting side. Because the facets become asymmetric in reflectivity, the optimized amount of phase shift is different from π.

Figure 4:
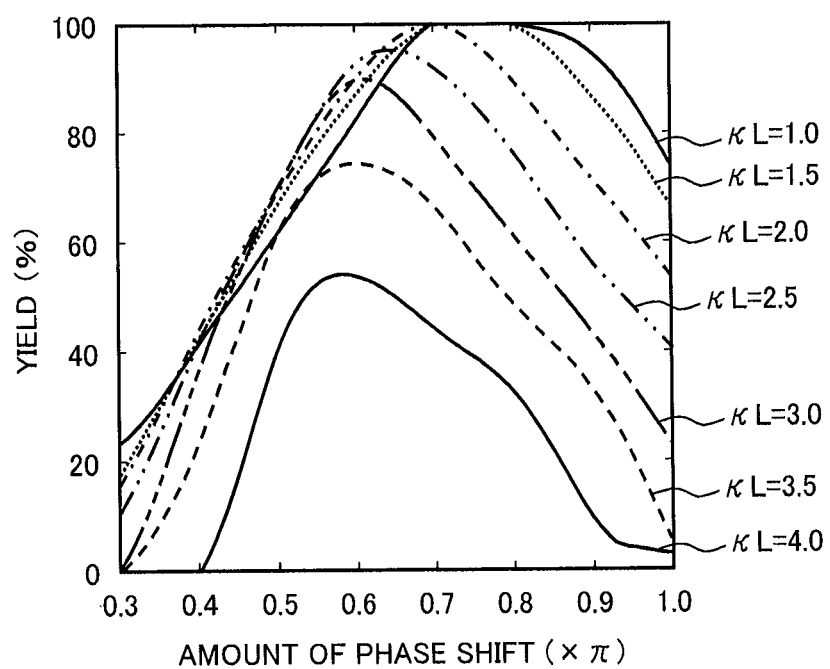
FIG. 4 is a view illustrating a result of calculation of a relationship between a single mode yield and an amount of phase shift in a CPM diffraction grating region.

FIG. 4 is a view illustrating a result of calculation of a relationship between the single mode yield and the amount of phase shift in the CPM diffraction grating region. The anti-reflection film and the reflection film are coated on the front facet and the rear facet of the semiconductor laser on which the calculation is performed, respectively, in the same manner as in the second reference example or the corresponding embodiment, and the center of the CPM diffraction grating region is arranged in a position that is 70% of the length of the cavity away from the front end of the diffraction grating (which is indicated as a length L of the cavity). That is, the center of the CPM diffraction grating region is arranged closer to the rear end than the front end of the diffraction grating. Additionally, the calculation is performed under the conditions that the reflectivity of the anti-reflection film coated on the front end facet is 0%, the reflectivity of the reflection film coated on the rear end facet is 90%, and the length of the CPM diffraction grating region is one third of the length of the cavity.

The calculation is performed on the assumption that under the conditions described above, κL that is a product of the optical coupling coefficient κ of the diffraction grating and the length L of the cavity changes in a range of 1.0 to 4.0. The amount of phase shift along the horizontal axis in FIG. 4 indicates a deviation in phase in both ends of the CPM diffraction grating region. For example, in a case of a λ/4-shift, the amount of phase shift is π, in which case the amount of phase shift is indicated as 1.0 (×π) on the right end of a graph in the drawing. Even though κL is anywhere in a range of 1.0 to 4.0, as the amount of phase shift is decreased from π (the right end), the yield is improved. Then, when a point at which the yield becomes the highest is passed, the yield is reduced after the point. For example, if κL is 1.0, a range of the amount of phase shift in which the yield is improved more than when the amount of phase shift is π is from equal to or more than 0.6 π to less than π. If κL is 2.0, the range of the amount of phase shift in which the yield is improved is from equal to or more than 0.45 π to less than π. If κL is 2.5, the range of the amount of phase shift in which the yield is improved is from equal to or more than 0.4 π to less than π. If κL is 4.0, the range of the amount of phase shift in which the yield is improved is from equal to or more than 0.42 π to less than π. Taking into consideration of FIG. 4, precision in fabrication, or the like, it is preferable that the amount of phase shift of the CPM diffraction grating region should range from equal to or more than 0.6 π to equal to or less than 0.9 π. Moreover, in order to further improve the yield, it is preferable that the amount of phase shift in the range in which κL is from 2 to 2.5 should in a range of equal to or more than 0.55 π to equal to or less than 0.75 π in which the yield is equal to or more than 80%.

According to the corresponding embodiment, as described above, the optical coupling coefficient κ of the diffraction grating is 150 cm$^{-1}$, the length $L_{OS}$ of the cavity is 150 μm, and κL is 2.25. Therefore, according to the corresponding embodiment, the amount of phase shift of the CPM diffraction grating region (the second diffraction grating region 22) is set to be 0.75 π. Additionally, the second pitch $\Lambda_{CPM}$ and the length $L_{CPM}$ of the CPM diffraction grating are determined based on the first pitch $\Lambda_{STD}$ and the amount of phase shift. A description of details is provided as follows. The second pitch $\Lambda_{CPM}$ can be expressed in Formula 2 as follows, using the first pitch $\Lambda_{STD}$ and the length $L_{CPM}$ of the CPM diffraction grating.

$$\Lambda_{CPM} = \Lambda_{STD} + \frac{n\Lambda_{STD}^2}{2L_{CPM}} \qquad \text{Formula 2}$$

At this point, n is a value indicating 1/π times the amount of phase shift, and for example, when n=1, the phase is shifted by π. As described above, according to the corresponding embodiment, the amount of phase shift is to be 0.75 π and n=0.75. First, the length $L_{CPM}$ of the CPM diffraction grating is set to (n/2+M) (M is a natural number) times the first pitch $\Lambda_{STD}$ in such a manner that the phase shift between the first diffraction grating region 21 and the third diffraction grating region 23 is 0.75 π (n=0.75). According to the corresponding embodiment, M is set to be 250 (M=250) and $L_{CPM}$=50.075 μm. Next, when the second pitch $\Lambda_{CPM}$ is obtained in such a manner as to satisfy a relationship in Formula 2, it follows that $\Lambda_{CPM}$=200.2996 nm. Moreover, here, n=0.75 but n is not limited to this value. Because the amount of phase shift of the CPM diffraction grating region preferably should range from equal to or more than 0.6 π to equal to or less than 0.9 π, a selection may be made in such a manner that 0.6≤c≤0.9.

Additionally, π is equivalent to 3π (=π+2kπ) in terms of the amount of phase shift. Furthermore, even though the second pitch $\Lambda_{CPM}$ is set to be shorter than the first pitch $\Lambda_{STD}$, a desired amount of phase shift can be realized. Therefore, in Formula 2, Formula 2 can be further extended by replacing n with ±(n+2k). At this point, k is an integer equal to or greater than 0 (k=0, 1, 2, . . . ).

Moreover, according to the corresponding embodiment, the InGaAsP waveguide layer 14 is formed for the perspective of ease of performing cleaving in the fabrication process, this does not impose any limitation. It goes without saying that the same effect can be obtained even with the semiconductor laser that is formed by cleaving the active layer (the semiconductor multilayer including the active layer) without using a waveguide layer. Furthermore, according to the corresponding embodiment, the InGaAsP diffraction grating layer 7 is formed directly on the upper surface of the InGaAsP etching stop layer 6, but this does not impose any limitation. For example, the optical coupling coefficient κ of the diffraction grating may be improved by changing a composition wavelength with a thickness to which the diffraction grating is engraved. Furthermore, even though a so-called floating-type diffraction grating that is formed inside an InP layer is used for the diffraction grating, the effects of the present invention are obtained.

Second Embodiment

Figure 5:
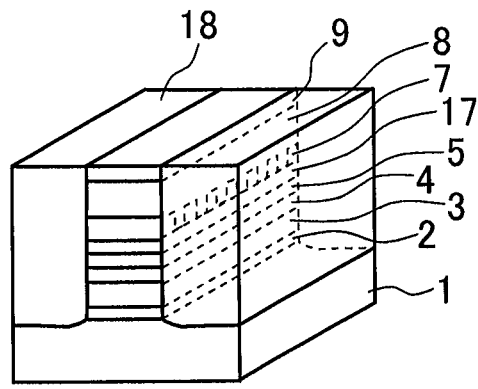
FIG. 5 is a perspective view of an entire main portion of a semiconductor laser according to a second embodiment of the present invention.
Figure 6:
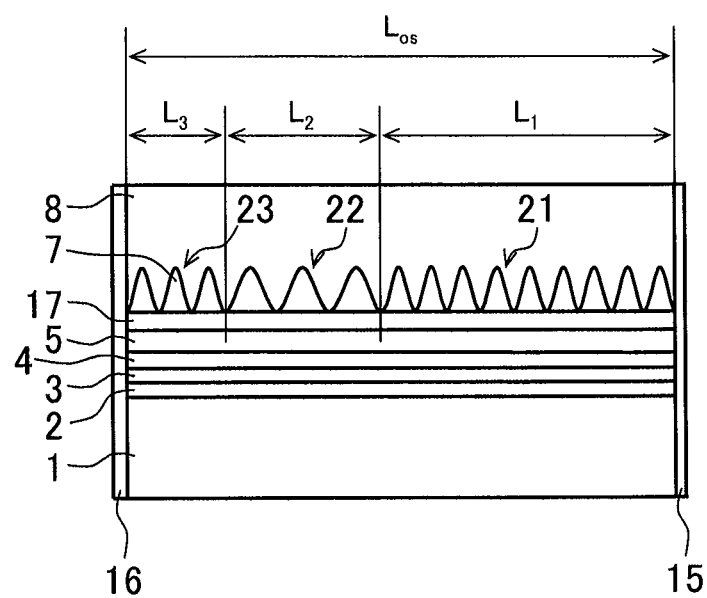
FIG. 6 is a cross-sectional view of the semiconductor laser according to the second embodiment of the present invention.

A semiconductor laser according to a second embodiment of the present invention, although it is a case where the present invention is applied to a BH laser element, is the same as the first embodiment in terms of the configuration of the dielectric film that is coated on both facets of the laser element. A structure of a diffraction grating layer is different from that according to the first embodiment, but this is described below. Moreover, a BH laser element is a semiconductor laser that has a buried hetero (BH) structure. The BH structure refers to a structure in which both ends having a mesa stripe structure, which is formed by removing regions, which are both ends of the optical waveguide, of the semiconductor multilayer including the active layer, are buried into a semi-insulation semiconductor layer. That is, the optical confinement structure and the current constriction structure of the laser element are buried-types. FIG. 5 is a perspective view of an entire main portion of the semiconductor laser according to the corresponding embodiment. FIG. 6 is a cross-sectional view of the semiconductor laser according to the corresponding embodiment. FIG. 6 illustrates a cross-section of the inside the laser element, which includes an optical axis of light and extends in a deposition direction. For the sake of brief description, a p-type electrode 12 and an n-type electrode 13 are omitted in FIGS. 5 and 6, but in fact, the p-type electrode 12 is formed to come into contact with a p-type InGaAs contact layer 9 in the same manner as in the semiconductor laser according to the first embodiment, and an n-type electrode 13 is formed on the lower surface (the rear surface) of an n-type InP substrate 1.

The semiconductor laser according to the corresponding embodiment is an element that results from depositing a semiconductor multilayer on the n-type InP substrate 1, but, as described above, the semiconductor laser has a BH structure, and the corresponding semiconductor multilayer has a mesa stripe structure. Moreover, an n-type InP buffer layer is formed on an upper surface of the n-type InP substrate 1, but this is not illustrated in FIGS. 5 and 6 in the same as in FIGS. 1 and 2. As illustrated in FIGS. 5 and 6, an n-type InGaAlAs-SCH layer 2, an InGaAlAs-MQW layer 3, a p-type InGaAlAs-SCH layer 4, a p-type InAlAs electron stop layer 5, an InP layer 17, an InGaAsP diffraction grating layer 7, a p-type InP clad layer 8, and a p-type InGaAs contact layer 9 are deposited on the n-type InP substrate 1 in this sequence to form the semiconductor multilayer. At this point, the InGaAlAs-MQW layer 3 is a multi-quantum well layer that has 9 well layers. Furthermore, the InGaAsP diffraction grating layer 7 is formed between the InP layer 17 and the p-type InP clad layer 8 and is a so-called floating-type diffraction grating. The corresponding semiconductor laser has a mesa stripe structure by removing a region, which extends outside the optical waveguide, of the corresponding semiconductor multilayer from the p-type InGaAs contact layer 9, an uppermost layer, down to one portion of the n-type InP substrate 1. Moreover, a mesa width of the mesa stripe structure is 1.3 μm. Both ends (both sides) of the mesa stripe structure are buried into semi-insulation semiconductor buried layer 18. The semiconductor laser according to the corresponding embodiment, as described above, is a BH laser element that has the BH structure. A material of the semi-insulation semiconductor buried layer 18 is InP that is doped with, for example, iron (Fe) or ruthenium (Ru). As illustrated in FIG. 6, unlike in the first embodiment, the InGaAsP waveguide layer 14 is not formed, the right side end surface of the semiconductor laser is consistent with the right side end surface of the semiconductor multilayer including the InGaAlAs-MQW layer 3 and the InGaAsP diffraction grating layer 7. Moreover, on an InGaAsP diffraction grating layer 7, a first diffraction grating region 21, a second diffraction grating region 22, and a third diffraction grating region 23 are arranged sequentially and contiguously side by side along a direction of light propagation (an extending direction of the optical waveguide) beginning from a light-emitting side, in the same manner as in the first embodiment.

In the semiconductor laser according to the corresponding embodiment, an anti-reflection film 15 is coated on the end facet (the front end facet) from which to emit signal light and a reflection film 16 is coated on the end facet (the rear end facet) which is opposite to the end facet from which to emit signal light. At this point, the reflection suppression film 15 is a low reflection film (the low reflection coating layer) that is equal to or less than 0.1% in the effective reflectivity on the end facet, and the reflection film 16 is a high reflection film (the high reflection coating layer) that is 90% in the reflectivity on the end facet.

A length, which runs along the direction of light propagation, of the semiconductor multilayer including the InGaAlAs-MQW layer 3 and the InGaAsP diffraction grating layer 7 is a length $L_{OS}$ of a cavity, and a length of the semiconductor laser is the length $L_{OS}$ of the cavity. Here, the length is set to 150 μm. A height of a convex portion of the InGaAsP diffraction grating layer 7 is 52 nm, and an optical coupling coefficient κ of the diffraction grating is 145 cm$^{-1}$ in either of the first diffraction grating region 21, the second diffraction grating region 22, and the third diffraction grating region 23. Therefore, a product of the optical coupling coefficient κ and a length L of a cavity is κL=2.175. The first diffraction grating region 21 and the third diffraction grating region 23 have a periodic structure with a pitch of 202 nm (a first pitch: $\Lambda_{STD}$). In the semiconductor laser according to the corresponding embodiment, an amount of phase shift of the second diffraction grating region 22 (the CPM diffraction grating) is set to be 0.7 π, and is n=0.7 in Formula 2. A length $L_{CPM}$ of the CPM diffraction grating is set to (n/2+M) (M is a natural number) times a first pitch $\Lambda_{STD}$ in such a manner that the phase shift between the first diffraction grating region 21 and the third diffraction grating region 23 is 0.7 π (n=0.7). According to the corresponding embodiment, M=347, and $L_{CPM}$=70.1647 μm. A second pitch $\Lambda_{CPM}$ of the second diffraction grating region 22 (the CPM diffraction grating region) is obtained from Formula 2, and the second diffraction grating region 22 has a periodic structure with a pitch of 202.2035 nm (the second pitch: $\Lambda_{CPM}$). Accordingly, the phase of the diffraction grating in the InGaAsP diffraction grating layer 7 can be successively changed over first to third diffraction grating regions. Moreover, for the center of the second diffraction grating region 22, a distance from the front end of the cavity to the center of the second diffraction grating region 22 is 105 μm (70% of the length $L_{OS}$ of the cavity).

The semiconductor laser according to the corresponding embodiment has the optical coupling coefficient κ of the diffraction grating with a value as high as 145 cm$^{-1}$, and has the length $L_{OS}$ of the cavity with a value as low as 150 μm. For that reason, the threshold current is 2.4 mA at a temperature of 25° C., and is 4.5 mA at a temperature of 55° C. Thus, the low threshold current can be realized. Additionally, a single mode yield of a wavelength in terms of pulse measurement is 98%, and an improvement in the yield is realized. Excellent characteristics are realized to such an extent that inclinations of a relaxation oscillation frequency $f_r$ with respect to the square root of a drive current are 4.2 GHz/mA$^{1/2}$ and 3.4 GHz/mA$^{1/2}$ at temperatures of 25° C. and 55° C., respectively. Additionally, although the optical coupling coefficient κ is great, characteristic deterioration (roll-off of a band) in the low frequency range of the band is suppressed in terms of small-signal modulation characteristics and high frequency characteristics can be obtained to such an extent that 3 dB bandwidth f3 dB is approximately 23 GHz. The semiconductor laser according to the corresponding embodiment has a low threshold current and high frequency characteristics. Thus, under the conditions that a transmission speed is 27.952 Gb/s that is an OTU4 specification, a bias current is 55 mA, and a drive temperature is 55° C., high characteristics can be realized to such an extent that an obtained extinction ratio is 5.7 dB and a mask margin in terms of IEEE mask is 23%. Moreover, the semiconductor laser according to the corresponding embodiment can obtain such high reliability that an estimated life time is $2.4 \times 10^5$ hours at a drive temperature of 55° C.

The semiconductor laser according to the corresponding embodiment is a semiconductor laser that is formed by cleaving an active layer (the semiconductor multilayer that includes the active layer), but this does not impose any limitation. It goes without saying that the same effect can be obtained even with the semiconductor laser in which the length of the cavity is shortened more than the laser element length by integrating the waveguide layers. Furthermore, according to the semiconductor laser according to the corresponding embodiment, a so-called floating-type diffraction grating is used, but it goes without saying that the same effect is obtained although the diffraction grating which is engraved halfway through the InGaAsP diffraction grating layer 7 and in which the p-type InAlAs electron stop layer 5 is formed immediately under the InGaAsP diffraction grating layer 7 is used.

Third Embodiment

Figure 7:
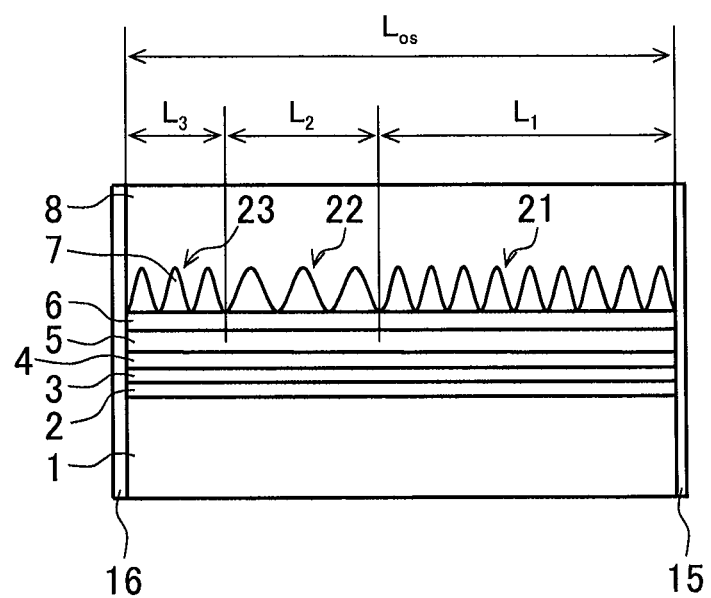
FIG. 7 is a cross-sectional view of a semiconductor laser according to a third embodiment of the present invention.

A semiconductor laser according to a third embodiment of the invention is a ridge-waveguide-type DFB laser element that oscillates in a 1.3 µm band, and has the same structure as the semiconductor laser according to the first element except for the fact that the InGaAsP waveguide layer 14 is not formed and for what is described below. FIG. 7 is a cross-sectional view of the semiconductor laser according to the corresponding embodiment. FIG. 7, like FIG. 2, illustrates a cross-section of the inside the laser element, which includes an optical axis of light and extends in a deposition direction. FIG. 7 is the same as FIG. 2 except that the portion (including an InGaAsP waveguide layer 14) illustrated as a length $L_W$ of a waveguide layer in FIG. 2 is not illustrated.

In the semiconductor laser according to the corresponding embodiment, a length $L_{OS}$ of a cavity is 120 µm. A height of a convex portion of an InGaAsP diffraction grating layer 7 is 58 nm, and an optical coupling coefficient κ of the diffraction grating is 170 cm$^{-1}$ in either of a first diffraction grating region 21, a second diffraction grating region 22, and a third diffraction grating region 23. Therefore, a product of the optical coupling coefficient κ and a length L of a cavity is κL=2.04. The first diffraction grating region 21 and the third diffraction grating region 23 have a periodic structure with a pitch of 201 nm (a first pitch: $\Lambda_{STD}$). The semiconductor laser according to the corresponding embodiment, an amount of phase shift of the second diffraction grating region 22 (a CPM diffraction grating) is set to be 0.71 π and is n=0.71 in Formula 2. A length $L_{CPM}$ of the CPM diffraction grating is set to (n/2+M) (M is a natural number) times a first pitch $\Lambda_{STD}$ in such a manner that a phase shift between the first diffraction grating region 21 and the third diffraction grating region 23 is 0.71 π (n=0.71). According to the corresponding embodiment, M=249 and $L_{CPM}$=50.1204 µm. A second pitch $\Lambda_{CPM}$ of the second diffraction grating region 22 (a CPM diffraction grating region) is obtained from Formula 2, and the second diffraction grating region 22 has a periodic structure with a pitch of 201.286 nm (the second pitch: $\Lambda_{CPM}$). Accordingly, a phase of the diffraction grating in the InGaAsP diffraction grating layer 7 can be successively changed over first to third diffraction grating regions. Moreover, for the center of the second diffraction grating region 22, a distance from the front end of the cavity to the center of the second diffraction grating region 22 is 90 µm (75% of the length $L_{OS}$ of the cavity).

The semiconductor laser according to the corresponding embodiment has the optical coupling coefficient κ of the diffraction grating with a value as high as 170 cm$^{-1}$, and has the length $L_{OS}$ of the cavity with a value as low as 120 µm. For that reason, although the semiconductor laser is a ridge-waveguide-type laser element, a threshold current is 2.4 mA at a temperature of 25° C., and is 4.1 mA at a temperature of 55° C. Thus, the low threshold current can be realized. Additionally, a single mode yield of a wavelength in terms of pulse measurement is 97%, and an improvement in yield is realized. Excellent characteristics are realized to such an extent that inclinations of a relaxation oscillation frequency $f_r$ with respect to the square root of a drive current are 4.8 GHz/mA$^{1/2}$ and 3.7 GHz/mA$^{1/2}$ at temperatures of 25° C. and 55° C., respectively. Additionally, although the optical coupling coefficient κ is great, characteristic deterioration (roll-off of a band) in the low frequency range of the band is suppressed in terms of small signal frequency characteristics and high frequency characteristics can be obtained to such an extent that 3 dB bandwidth f3 dB is approximately 28 GHz. The semiconductor laser according to the corresponding embodiment has a low threshold current and high frequency characteristics. Thus, under the conditions that a transmission speed is 27.952 Gb/s that is an OTU4 specification, a bias current is 58 mA, and a drive temperature is 55° C., high characteristics can be realized to such an extent that an obtained extinction ratio is 5.73 dB and a mask margin in terms of IEEE mask is 32%.

The semiconductor laser according to the corresponding embodiment of the present invention is described above. As described above, in order to realize an increase in transmission speed in the semiconductor laser, it is preferable that the length L of the cavity be shortened. It is preferable that the length L of the cavity is equal to or less than 150 µm. In the same manner, it is preferable that the optical coupling coefficient κ of the diffraction grating be increased. It is preferable that the optical coupling coefficient κ be equal to or more than 120 cm$^{-1}$. Additionally, in order to realize a high yield while both shortening the length L of the cavity and increasing the optical coupling coefficient κ, it is preferable that κL, a product of the length L of the cavity and the optical coupling coefficient κ, should range from equal to or more than 2.0 to equal to or less than 2.5. According to the present invention, if a directly modulated laser element that uses the semiconductor laser with a diffraction grating structure is operated at a high transmission speed of equal to or more than 10 Gb/s, the lowering of threshold current and the decreasing of the bias current and of the drive current at the time of a high-speed operation can be realized and mask margins in the optical output waveform can be improved. Additionally, the yield of the single mode can be increased. An optical-semiconductor optical device according to the present invention is an optical semiconductor device using the semiconductor laser according to the present invention, and for example, is an optical transmitter and receiver using the semiconductor laser according to the present invention as a transmission light source. According to the present invention, the high-speed operation is possible, and the optical semiconductor device using a communication light source, which is capable of operating at high speed and is low in power consumption, can be realized.

The Internet is established as an infrastructure that is indispensable for living in the modern society from business to daily life, and an application range of the Internet is broadened to the extent of covering a range for data communication or blog to mail-order business, streaming, a digital book, or a social network service (SNS). An amount of traffic throughout optical network supporting the Internet, which results from the broadening of the application range, is on the increase. Because of this, a demand is increased for an optical communication transmitter and receiver that connects between high-speed routers. A connection distance between the high-speed routers is a short distance, compared to an optical transmission distance in the related art and in most of cases, is equal to or less than 10 km.

An increase in transmission speed from 10 Gb/s, which is a conventional speed, to 25 to equal to or more than 40 Gb/s is in progress. A key to whether the transmitter and receiver using the directly modulated laser element can be put into practical use depends on whether the mask margin of an eye pattern waveform at the time of the operation at the speed of 25 to 28 Gb/s can be secured. A mask that serves as a reference for definitely determining whether a signal is "1" or "0" is usually provided inside and outside the eye pattern, and for 100 Gb/s, a standardization is made with IEEE (25 Gb/s×4ch) or ITU-T (28 Gb/s×4ch). Additionally, in most cases, a router manufacturer requires that the mask margin be present further outside the mask in order to perform transmission without any trouble between the transmitters and receivers manufactured by different manufacturers. Because of this, the operation with the wide mask margin in the directly modulated laser element is required. In the semiconductor lasers according to the first to third embodiments of the present invention, the wide mask margin that meets the related specification for the mask margin is realized and is optimized from the directly modulated laser element that is used as the communication light source. Additionally, the optical semiconductor device according to the present invention is optimized for the transmitter and receiver using the directly modulated laser element.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A semiconductor laser comprising:
    a diffraction grating in which a first diffraction grating region that has a periodic structure with a first pitch, a second diffraction grating region that has a periodic structure with a second pitch, different from the first pitch, and a third diffraction grating region that has the periodic structure of the first pitch, are arranged sequentially and contiguously side by side along a direction of light propagation beginning from a light-emitting side of the semiconductor laser;
    an anti-reflection film provided on a light-emitting side facet; and
    a reflection film provided on a facet that is opposite to the light-emitting side,
    wherein the first diffraction grating region is greater, in a length along the direction of light propagation, than the third diffraction grating region, and
    wherein the second diffraction grating region has the second pitch and a length, which runs along the direction of light propagation, in such a manner that a phase of the first diffraction grating region and a phase of the second diffraction grating region are successive on a boundary between the first and second diffraction grating regions and the phase of the second diffraction grating region and a phase of the third diffraction grating region are successive on a boundary between the second and third diffraction grating regions.

2. The semiconductor laser according to claim 1, wherein a structure of a cavity is a distributed feedback type.

3. The semiconductor laser according to claim 1, wherein the semiconductor laser has either a ridge-waveguide type structure or a buried type structure.

4. The semiconductor laser according to claim 1, further comprising:
    an active layer that includes an InGaAlAs multi-quantum well layer.

5. The semiconductor laser according to claim 1, wherein optical coupling coefficient of the diffraction grating is equal to or more than 120 cm$^{-1}$.

6. The semiconductor laser according to claim 1, wherein the length that runs along the direction of light propagation of the diffraction grating is equal to or less than 150 μm.

7. An optical semiconductor device comprising the semiconductor laser according to claim 1.

8. A semiconductor laser comprising:
    a diffraction grating in which a first diffraction grating region that has a periodic structure with a first pitch, a second diffraction grating region that has a periodic structure with a second pitch, different from the first pitch, and a third diffraction grating region that has the periodic structure with the first pitch are arranged sequentially and contiguously side by side along a direction of light propagation beginning from a light-emitting side of the semiconductor laser;
    an anti-reflection film provided on a light-emitting side facet; and
    a reflection film provided on a facet that is opposite to the light-emitting side,
    wherein a first length along the direction of light propagation of the first diffraction grating region is greater than a third length of the third diffraction grating region,
    wherein the second diffraction grating region has the second pitch and a second length, which runs along the direction of light propagation, in such a manner that a phase of the first diffraction grating region and a phase of the second diffraction grating region are successive on a boundary between the first and second diffraction grating regions and the phase of the second diffraction grating region and a phase of the third diffraction grating region are successive on a boundary between the second and third diffraction grating regions,
    wherein the periodic structure of the second diffraction grating region includes at least one cycle.

9. The semiconductor laser according to claim 8, wherein the second length of the second diffraction grating region is greater than half of the wavelength of light emitted from the semiconductor laser.

10. The semiconductor laser according to claim 8, wherein a structure of a cavity is a distributed feedback type.

11. The semiconductor laser according to claim 8, wherein the semiconductor laser has either a ridge-waveguide type structure or a buried type structure.

12. The semiconductor laser according to claim 8, further comprising:
    an active layer that includes an InGaAlAs multi-quantum well layer.

13. The semiconductor laser according to claim 8, wherein optical coupling coefficient of the diffraction grating is equal to or more than 120 cm$^{-1}$.

14. The semiconductor laser according to claim 8, wherein the length that runs along the direction of light propagation of the diffraction grating is equal to or less than 150 μm.

15. An optical semiconductor device comprising the semiconductor laser according to claim 8.

* * * * *